(12) United States Patent
Baluswamy et al.

(10) Patent No.: US 6,484,060 B1
(45) Date of Patent: Nov. 19, 2002

(54) LAYOUT FOR MEASUREMENT OF OVERLAY ERROR

(75) Inventors: Pary Baluswamy; Tim H. Bossart, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/533,785

(22) Filed: Mar. 24, 2000

(51) Int. Cl.[7] .................... H01L 21/66; H01L 23/544
(52) U.S. Cl. ................. 700/58; 700/121; 438/18; 438/401; 438/462; 257/797
(58) Field of Search ................ 700/56–59, 95–98, 700/108–110, 117–125; 356/399–401; 430/5, 22, 311–319; 438/14, 17, 18, 400, 401, 460, 462; 257/797

(56) References Cited

U.S. PATENT DOCUMENTS

| | | | |
|---|---|---|---|
| 4,697,087 A | 9/1987 | Wu ........................... 250/548 |
| 4,703,434 A | 10/1987 | Brunner ...................... 364/488 |
| 4,907,039 A | * 3/1990 | Chikaki ...................... 257/734 |
| 5,216,257 A | 6/1993 | Brueck et al. .............. 250/248 |
| 5,438,413 A | * 8/1995 | Mazor et al. ............... 356/363 |
| 5,545,593 A | * 8/1996 | Watkins et al. .............. 438/16 |
| 5,552,251 A | 9/1996 | Hawang ........................ 430/5 |
| 5,627,083 A | 5/1997 | Tounai ........................ 438/18 |
| 5,640,053 A | * 6/1997 | Caldwell ..................... 257/797 |
| 5,696,590 A | 12/1997 | Makita ....................... 356/399 |
| 5,712,707 A | 1/1998 | Ausschnitt et al. ......... 356/401 |
| 5,756,238 A | 5/1998 | Barr et al. .................... 430/5 |
| 5,757,507 A | 5/1998 | Ausschnitt et al. ......... 356/401 |
| 5,766,809 A | 6/1998 | Bae ........................... 430/22 |
| 5,776,645 A | 7/1998 | Barr et al. .................. 430/22 |
| 6,079,256 A | * 6/2000 | Bareket ....................... 73/105 |
| 6,288,454 B1 | * 9/2001 | Allman et al. .............. 257/797 |
| 6,319,791 B1 | * 11/2001 | Ando .......................... 438/401 |
| 6,340,547 B1 | * 1/2002 | Chen et al. .................. 430/22 |

* cited by examiner

*Primary Examiner*—Maria N. Von Buhr
(74) *Attorney, Agent, or Firm*—Dickstein Shapiro Morin & Oshinsky LLP

(57) ABSTRACT

In the manufacture of a multi-lay integrated circuit, a reference target is etched into a test wafer along with circuit features of a reference layer. As successive dependent layers are printed, successive dependent targets overlaying the same reference target are formed in photoresist. As each successive dependent target is printed, the degree to which it is registered with the reference target is used to determine the overlay error. After determination of overlay error for a layer, the layer's dependent target is removed, allowing the reference target to be matched with the dependent target of another layer.

22 Claims, 3 Drawing Sheets

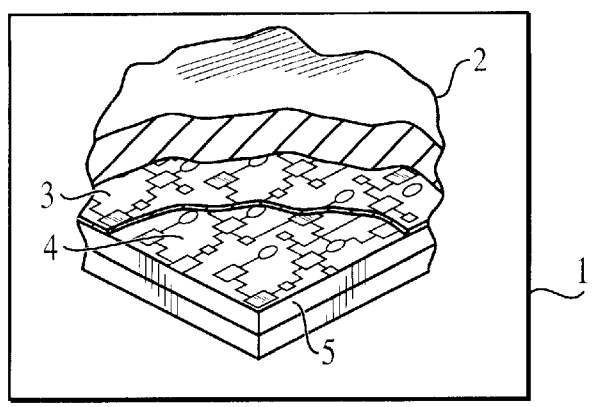
FIG. 1
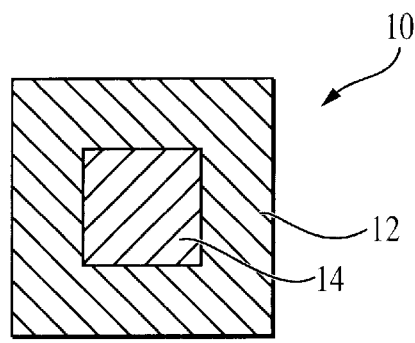
FIG. 2
FIG. 3
{
50_20
41_20
38_50
41_50
43_50
}

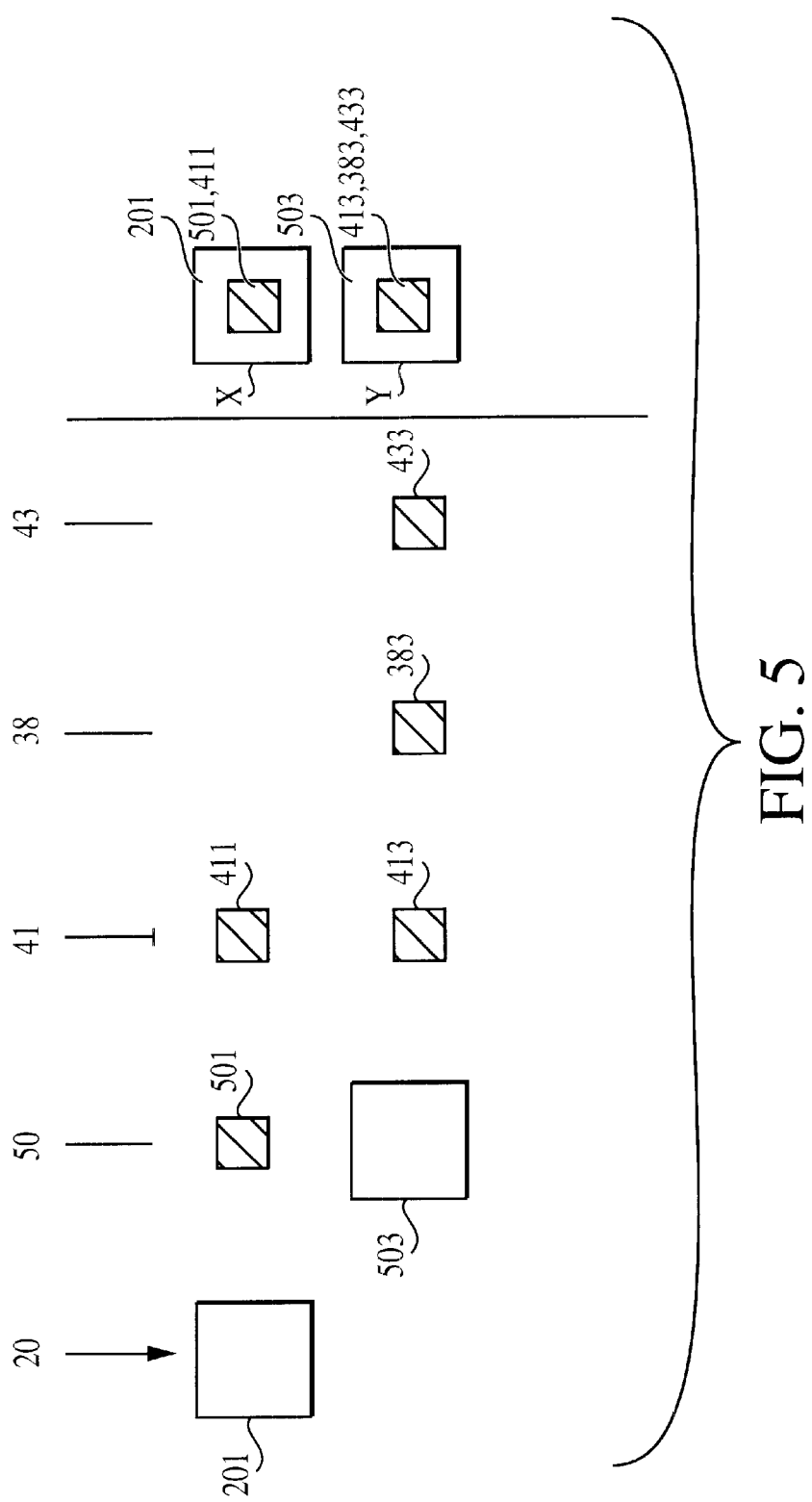

LAYOUT FOR MEASUREMENT OF OVERLAY ERROR

FIELD OF THE INVENTION

The present invention relates to photo lithography processes for manufacturing integrated circuits. More particularly, the invention relates to a system for measurement of overlay error between a wafer pattern and a reticle pattern projected onto the wafer.

BACKGROUND OF THE INVENTION

As shown in FIG. 1, modern electronic devices 1 have integrated circuits 2 which include multiple layers 3, 4 of circuitry features formed on a semiconductor substrate 5. Photo lithography is used to form these layers. A reticle is used in the manufacture of each layer of circuitry. Patterns on the reticles are designed to be placed on a pre-defined grid located on dies or scribe channels. The patterns are not always placed correctly on the grid leading to overlay errors between successively used reticles.

A high degree of alignment must be maintained between layers to ensure that circuit elements are properly registered with each other. Alignment is important because semiconductor manufacturing involves small feature dimensions. Present manufacturing processes routinely reach critical dimensions of 0.5 microns. The critical dimension is the smallest separation allowed between circuit elements. Even minute alignment errors can render an integrated circuit unusable.

Alignment refers to the process of registering a layer's reticle to a wafer. Several methods of alignment are known. For instance, in the dark field alignment method, alignment targets on the wafer are illuminated by an alignment illumination source. Light from the alignment illumination source floods the wafer surface and is back-scattered by edges of the wafer target and reflected by the wafer target itself. The intensity and position of back-scattered radiation is detected and compared with the position of the alignment targets on the reticle to determine the degree of alignment between the mask and wafer.

Overlay is an after-exposure measure of how accurately the alignment process was carried out. Overlay is the measure of success in the alignment process after a dependent layer or area has been exposed and developed. In the simplest form, the overlay process consists of comparing the location of an image in a second, or dependent, layer to an image in a first, or reference, layer. The degree to which the dependent layer was accurately aligned to the reference layer is determined by the degree to which the dependent image overlays the reference image. Any offset of the images demonstrates a mis-alignment.

The overall alignment and registration of a set of reticles developed for the production of a particular integrated circuit is often checked prior to actual production in an off-line procedure using a silicon test wafer. This measurement may be accomplished using a box within a box technique. In this technique, a rectangular box in the dependent layer is exposed on a similar, but larger, box on the reference layer. Overlay is measured by comparing the dimensions between the boxes on opposite sides, i.e., by measuring how well centered the smaller boxes are inside the larger boxes.

Construction of an overlay target pair 10 is illustrated in FIG. 2. When the reference layer of circuitry is produced on the test wafer using a reference layer reticle, a large reference box 12 is etched into the substrate. During the printing of the dependent layer of circuitry using a dependent layer reticle, a small box 14 is deposited in hardened photoresist. The position of the small box 14 of photoresist in the dependent layer is compared to the position of the etched large box 12 in the reference layer to determine the overlay error between the dependent and reference layers. If the layers are perfectly aligned, the small box 14 will be precisely centered within the large box 12. The degree to which the small box 14 is not centered within the large box 12 is a measure of the overlay error between the dependent and reference layers. Measurement of the overlay error is accomplished with hardware and software packages known in the art.

It is not uncommon for many layers of circuitry to be manufactured into a chip. Depending on the architecture of the integrated circuit, each circuitry layer can connect to adjacent layers or more remote layers. Each connection between layers creates an alignment dependency. There are multiple dependencies in a typical integrated circuit. These multiple dependencies between layers can be represented as a string of required targets. A typical overlay target string is illustrated in FIG. 3. In this figure, the reference layers are placed in the right column and dependent layers are placed in the left column. Each horizontal pairing represents a dependent layer's dependence on a reference layer. In this target string a first layer 20 is manufactured into the chip. Two successive, dependent layers 50 and 41 must be aligned with layer 20 as indicated by the first and second pairings of the overlay target string. (Layer numbering is typically independent of the order of the layers.) Layer 50, the second layer manufactured into the chip, becomes a reference layer in turn with three dependent layers 41, 38 and 43 that must be aligned with it, as shown in the third through fifth pairings.

The construction of the target string through the layers is illustrated in FIG. 4. In FIG. 4 each column to the left of the vertical line represents the target activity of each layer of the integrated circuit. The column to the right of the vertical line represents the cumulative target string. Two reference box targets 200, 202, one for each of layer 20's dependent layers, are etched into the test wafer. During the printing of layer 50, a dependent box target 500 is deposited in hardened photoresist. The overlay error between layer 20 and 50 is determined based on the degree to which dependent box target 500 is centered with reference box target 200. As the testing process continues, three reference box targets 504, 506 and 508, one each for each layer 50's dependent layers, are etched into the wafer.

During the printing of layer 41, two dependent box targets 412, 414 are deposited in hardened photoresist. The overlay error between layer 41 and layers 20 and 50 can be determined based on the degree to which dependent box targets 412 and 414 are centered within reference box targets 202 and 504, respectively.

During the printing of layer 38, a dependent box target 386 is deposited in hardened photoresist. The overlay error between layer 38 and layer 50 can be determined based on the degree to which dependent box target 386 is centered within reference box target 506. During the printing of layer 43, a dependent box target 438 is deposited in hardened photoresist. The overlay error between layer 43 and layer 50 can be determined based on the degree to which dependent box target 438 is centered within reference box target 508.

The target string for the entire process of five layers with five interdependencies is represented in the right column. The target string consists of five reference-dependent target pairs A–E.

The technology used in analyzing overlay targets requires certain layout rules. References boxes are typically 20 microns square and are laid out on the surface of the chip at a 50 micron pitch. The dependent boxes are 10 microns square. Thus, when multiple layers are processed on a wafer, a significant area of the wafer must be dedicated to placement of target strings. Real estate on the surfaces of integrated circuits is limited and expensive, however. What is required then, is an improved layout for target strings in multi-layer photolithographic processes for integrated circuits that conserves the area required for overlay measurement.

SUMMARY OF THE INVENTION

The invention concerns a method for laying out reference targets for measurement of overlay error in the manufacture of multi-layer integrated circuits.

According to one aspect of the invention, a reference target, which may be a square, is etched onto a test wafer along with the circuitry of the reference layer. In each subsequent layer dependent on the reference layer, a dependent target, which may be a square smaller than the reference target, is printed in a dependent target region along with the circuitry pattern of the dependent layer such that the dependent target in each dependent layer is registered with the reference target of the reference layer. The dependent target of each subsequent layer is removed from the dependent target region prior to the next dependent layer, allowing multiple dependent targets to be used to register dependent layers to one reference target.

According to one aspect of the invention, only one reference box target is etched into a given layer no matter how many dependencies to subsequent layers exist. Instead of etching a reference box target for each subsequent dependent layer, the same reference box target is used for each subsequent dependent layer. This improved layout method takes advantage of the ephemeral nature of the dependent box targets as opposed to the permanent nature of the reference box targets.

In another aspect of the invention, the dependent target region of each dependent layer is aligned with the reference box target.

The above and other advantages and features of the invention will be more readily understood from the following detailed description of the invention which is provided in connection with the accompanying drawings.

BRIEF DESCRIPTION OF THE DRAWINGS

FIG. 1 is a cut-away perspective drawing of an electronic device incorporating an integrated circuit.

FIG. 2 is a schematic diagram of an overlay target pair.

FIG. 3 illustrates a typical overlay target string.

FIG. 5 is a schematic diagram of an improved layout scheme of a target string of a multi-layer process.

DETAILED DESCRIPTION OF PREFERRED EMBODIMENTS

Figure 4:
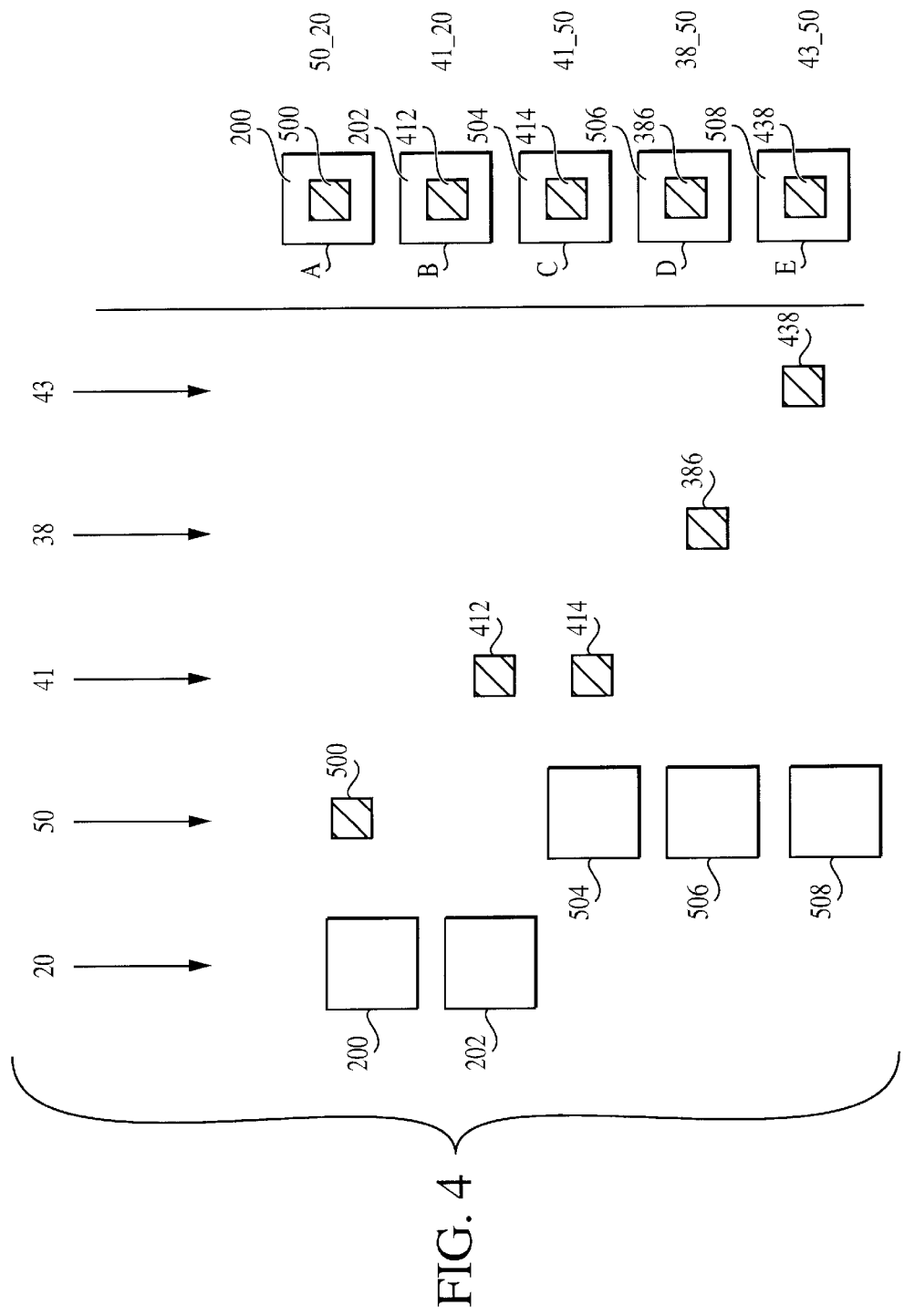
FIG. 4 is a schematic diagram of a target string of a multi-layer process.

Referring now to FIG. 5, an improved layout for overlay measurement is illustrated. This improved layout also effects the overlay target string of FIG. 2. Like FIG. 3, each column of FIG. 5 to the left of the vertical line represents the target activity of each layer of the integrated circuit. The column to the right of the vertical line represents the cumulative target string.

One reference box target 201 is etched into the test wafer (not illustrated) during the manufacture of layer 20. Next, layer 50 is printed. During the printing of layer 50, a dependent box target 501 is deposited in hardened photoresist. The overlay error between layers 20 and 50 is determined based on the degree to which dependent box target 501 is centered within reference box target 201. As the manufacturing process for layer 50 continues, one reference box target 503 is etched into the test wafer.

As the test wafer is prepared for the printing of layer 41, dependent box target 501 is removed, e.g., chemically washed away. During the printing of layer 41, two dependent box targets 411, 413 are deposited in hardened photoresist. The overlay error between layer 41 and layers 20 and 50 can be determined based on the degree to which dependent box targets 411 and 413 are centered within reference box targets 201 and 503, respectively.

As the wafer is prepared for the printing of layer 38, dependent boxes 411, 413 are removed. During the printing of layer 38, one dependent box target 383 is deposited in hardened photoresist. The overlay error between layer 38 and layer 50 can be determined based on the degree to which dependent box target 383 is centered within reference box target 503.

As the test wafer is prepared for the printing of layer 43, dependent box target 383 is removed. During the printing of layer 43, one dependent box target 433 is deposited in hardened photoresist. The overlay error between layer 43 and layer 50 can be determined based on the degree to which dependent box target 433 is centered within reference box target 503.

The target string for the entire process of five layers with five interdependencies is represented in the right column. The target string consists of two reference-dependent target pairs X–Y. Use of the improved layout uses only 40% of the real estate of an integrated circuit compared to the layouts shown in FIG. 4 in this simple example. As will be appreciated by those skilled in the art, even greater target string reductions may be attained using the invention on more complex integrated circuits with more layers and more dependencies.

The invention provides a method of conserving valuable real estate of integrated circuits by using the same region of the field to check overlay error of reticles instead of separate areas for each individual dependent layer pair. Because of the smaller area utilized, the overlay string can be added to many more locations in the field. This allows better characterization of the reticle to reticle matching. The normal target string is too large to be added in multiple locations on production reticles. Variations of the disclosed embodiments will be readily apparent to those skilled in the art. Accordingly, it is to be understood that although the present invention has been described with reference to an exemplary embodiment, various modifications may be made without departing from the spirit or scope of the invention which is defined solely by the claims appended hereto.

What is claimed as new and desired to be protected by letters patent of the united states is:

1. A method of laying out targets for a semiconductor product, said method comprising the steps of:

providing a reference target in a reference layer on a test wafer, said reference target registering subsequent layers dependent on said reference layer;

forming a dependent target in a dependant target location area of a subsequent layer dependent on said reference layer; and removing said dependent target of said subsequent layer.

2. The method of claim 1, further comprising the step of forming at least one additional dependent target in at least one additional dependent target location area of at least one additional subsequent layer dependent on said reference layer.

3. The method of claim 2, further comprising the step of removing said at least one additional dependent target of said at least one additional subsequent layer.

4. The method of claim 1, further comprising the steps of:
   forming additional dependent targets in additional dependent target location areas of a plurality of additional subsequent layers dependent on said reference layer;
   removing said additional dependent targets of said additional subsequent layers.

5. The method of claim 4, further comprising the step of forming a last dependent target in a last dependent target area of a last subsequent layer dependent on said reference layer.

6. The method of claim 1, wherein said reference target is etched into said reference layer.

7. The method of claim 1, wherein said dependent target is formed of photoresist.

8. The method of claim 1, wherein said reference target comprises a square.

9. The method of claim 8, wherein said dependent target comprises a square smaller than said reference target.

10. The method of claim 1, wherein said dependent target location area is within an area bounded by said reference target.

11. A method of measuring overlay error for a multi-layer integrated circuit, said method comprising the steps of:
    providing a reference target in a reference layer on a test wafer;
    providing a dependent target in a dependent target location area of a subsequent layer dependent on said reference layer;
    comparing said dependent target to said reference target to determine any registration errors between said subsequent layer and said reference layer; and
    removing said dependent target.

12. The method of claim 11, further comprising the step of forming at least one additional reference target in at least one additional reference target location area of at least one additional subsequent layer dependent on said reference layer and comparing said at least one additional dependent target to said reference target to determine any registration errors between said at least one additional subsequent layer and said reference layer.

13. The method of claim 12, further comprising the step of removing said at least one additional dependent target of said at least one additional subsequent layer.

14. The method of claim 11, further comprising the steps of:
    forming additional dependent targets in a plurality of additional subsequent layers dependent on said reference layer;
    comparing said additional dependent targets to said reference target to determine any registration errors between said plurality of additional subsequent layers and said reference layer; and
    removing additional dependent targets of said additional subsequent layers.

15. The method of claim 14, further comprising the step of forming a last dependent target in a last dependent target area of a last subsequent layer dependent on said reference layer and comparing said last dependent target to said reference target to determine any registration errors between said last subsequent layer and said reference layer.

16. A method of making a multi-layer integrated circuit, said method comprising the steps of:
    providing a reference target in a reference layer on a test wafer, said reference target registering every subsequent layer dependent on said reference layer;
    forming subsequent layers dependent on said reference layer, each of said subsequent layers having a dependent target for comparison with said reference target; and
    removing said dependent targets from a prior one of said subsequent layers before having a succeeding one of said subsequent layers.

17. The method of claim 16, wherein said reference target is etched into the integrated circuit.

18. A method of making a multi-layer integrated circuit, said method comprising the steps of locating
    a first dependent target in a dependent target region of a test wafer;
    comparing said first dependent target to a reference target of a reference layer provided on said test wafer;
    removing said first dependent target; and
    subsequently, locating a second dependent target on a subsequent layer provided on said test wafer; and
    comparing said second dependent target to said reference target.

19. The method of claim 18, wherein said comparison further comprises the step of determining registration errors between said subsequent layer and said reference layer.

20. The method of claim 18, further comprising the step of etching said reference target into a reference layer.

21. The method of claim 18, wherein said dependent target region is smaller than said reference target.

22. The method of claim 21, wherein said dependent target is provided in an area bounded by said reference target.

* * * * *